(12) United States Patent
Kumath et al.

(10) Patent No.: US 8,093,985 B1
(45) Date of Patent: Jan. 10, 2012

(54) ARCHITECTURE FOR A HIGHLY ACCURATE DCP

(75) Inventors: Lokesh Kumath, Bangalore (IN); Giri N. K. Rangan, Bangalore (IN)

(73) Assignee: Intersil Americas Inc., Milpitas, CA (US)

( * ) Notice: Subject to any disclaimer, the term of this patent is extended or adjusted under 35 U.S.C. 154(b) by 589 days.

(21) Appl. No.: 12/242,926

(22) Filed: Oct. 1, 2008

Related U.S. Application Data (60) Provisional application No. 60/976,783, filed on Oct. 1, 2007.

(51) Int. Cl.
*H01C 13/00* (2006.01)
(52) U.S. Cl. .......... 338/334; 338/202; 338/49; 338/195; 341/153; 365/236
(58) Field of Classification Search .................. 338/334, 338/195, 49, 202; 341/168, 170, 183, 153; 365/154, 185, 236
See application file for complete search history.

(56) References Cited

U.S. PATENT DOCUMENTS

| | | | | |
|---|---|---|---|---|
| 5,548,550 | A * | 8/1996 | Zanders et al. | 365/185.08 |
| 6,384,762 | B2 * | 5/2002 | Brunolli et al. | 341/144 |
| 7,164,343 | B2 * | 1/2007 | Kessler et al. | 338/195 |
| 2002/0135458 | A1 * | 9/2002 | Drori et al. | 338/190 |

* cited by examiner

*Primary Examiner* — Kyung Lee
(74) *Attorney, Agent, or Firm* — Fogg & Powers LLC (57) ABSTRACT

Circuits, methods, and apparatus that provide highly accurate DCPs. One example provides a DCP that includes a resistor string having taps that may be selected by a corresponding number of switches under the control of a digital word. To compensate for parasitic switch resistances and for variations in the values of the resistor sting caused by processing tolerances, a voltage-controlled resistor (VCR) is placed in parallel with the resistor string and switches. A control voltage generated using a control loop adjusts the parallel VCR such that the resistance seen across the DCP is the desired value. The control loop compares a reference resistor to loop components that are scaled to the resistor string, switches, and VCR. The reference resistor may be an external resistor or an internal resistor. If the resistor is internal, it may be trimmed, for example with lasers or fuses.

19 Claims, 7 Drawing Sheets

ARCHITECTURE FOR A HIGHLY ACCURATE DCP

CROSS-REFERENCES TO RELATED APPLICATIONS

This application claims the benefit of U.S. provisional patent application No. 60/976,783, titled ARCHITECTURE FOR HIGHLY ACCURATE DCP, by Kumath et al., filed Oct. 1, 2007, which is hereby incorporated by reference.

BACKGROUND

Embodiments of the present invention relate generally to digitally controlled potentiometers (DCPs) and more specifically to DCPs that include a voltage-controlled resistor that compensates for resistance value errors caused by parasitics temperature, process, voltage, ageing, and other variations.

DCPs are particularly useful circuits that are found in many applications such as liquid crystal display televisions, personal digital assistants, medial devices, CD and DVD drives, set-top boxes, bar code scanners, digital cameras, and more. DCPs have three terminals, the first and second of which are the ends of a resistor string that includes a number of taps along the string, and a third node which is selectively connected to one of the taps. The selection of a tap is made using a wiper, which may be implemented using a number of transistor switches.

A DCP may have a voltage applied to the ends of the resistor string, which are the first and second nodes, and a ratioed voltage available at the third node. In this configuration, the DCP acts as a voltage divider. This configuration is useful in applications such as variable voltage regulators, analog signal processing, MP3 players, and voltage-controlled oscillators, among others.

Alternately, a DCP may also be used as a variable resistor, where the variable resistor is between the third or wiper node and one of the ends of the resistor string. This configuration is useful in applications such as programmable gain amplifiers, tunable filters, variable frequency oscillators, brightness controls for LEDs or LCDs, and industrial control applications, among others.

It is desirable to implement these various applications on integrated circuits. Unfortunately, it is very difficult to manufacture accurate DCPs on an IC. Resistors typically have variations of twenty percent or more in their value. Also, these resistances may vary with environmental changes such as temperature and power supply voltage. Further, they may be susceptible to long-term variations due to ageing.

Accordingly, what is needed are circuits, methods, and apparatus that provide DCPs having highly accurate resistance values.

SUMMARY

Accordingly, embodiments of the present invention provide circuits, methods, and apparatus that provide highly accurate DCPs. An exemplary embodiment of the present invention provides a DCP that includes a resistor string having taps that may be selected by a corresponding number of switches under the control of a digital word. To compensate for parasitic switch resistances and for variations in the values of the resistor sting caused by processing tolerances, a voltage-controlled resistor (VCR) is placed in parallel with the resistor string and switches, though in other embodiments the VCR may be placed in series with the switches. A control voltage generated using a control loop adjusts the VCR such that the resistance seen across the DCP is the desired value. The control loop compares a reference resistor to loop components that are scaled version of the DCP resistor string, switches, and VCR placed in parallel with the resistor string and switches. The sizes of the loop components are varied as different taps in the resistor string are selected. The reference resistor may be an external resistor or an internal resistor. If the resistor is internal, it may be trimmed, for example with lasers or fuses.

In typical embodiments of the present invention, the adjustment of the VCR, and thus the DCP resistance, is continuous. In other embodiments, it may be adjusted during specific times, such as start-up or during calibration or configuration procedures. By continuously adjusting the VCR, variations due to ageing, thermal gradients, supply variations, and other transitory phenomena are also compensated. Use of a control loop eliminates the need for laser, fuse, or other post-fabrication methods of trimming the resistor string. Switches may be made smaller with a higher resulting resistance since the switch resistance is compensated for by the VCR. This decreases parasitic switch capacitance, which increases stability when the DCP is used in a high frequency loop. Since the control loop compares reference components to a reference resistor, the resistance contributed by the resistor taps may be varied over a range by varying the reference resistor.

Various embodiments of the present invention may incorporate one or more of these or the other features described herein. A better understanding of the nature and advantages of the present invention may be gained with reference to the following detailed description and the accompanying drawings.

DESCRIPTION OF EXEMPLARY EMBODIMENTS

Figure 1:
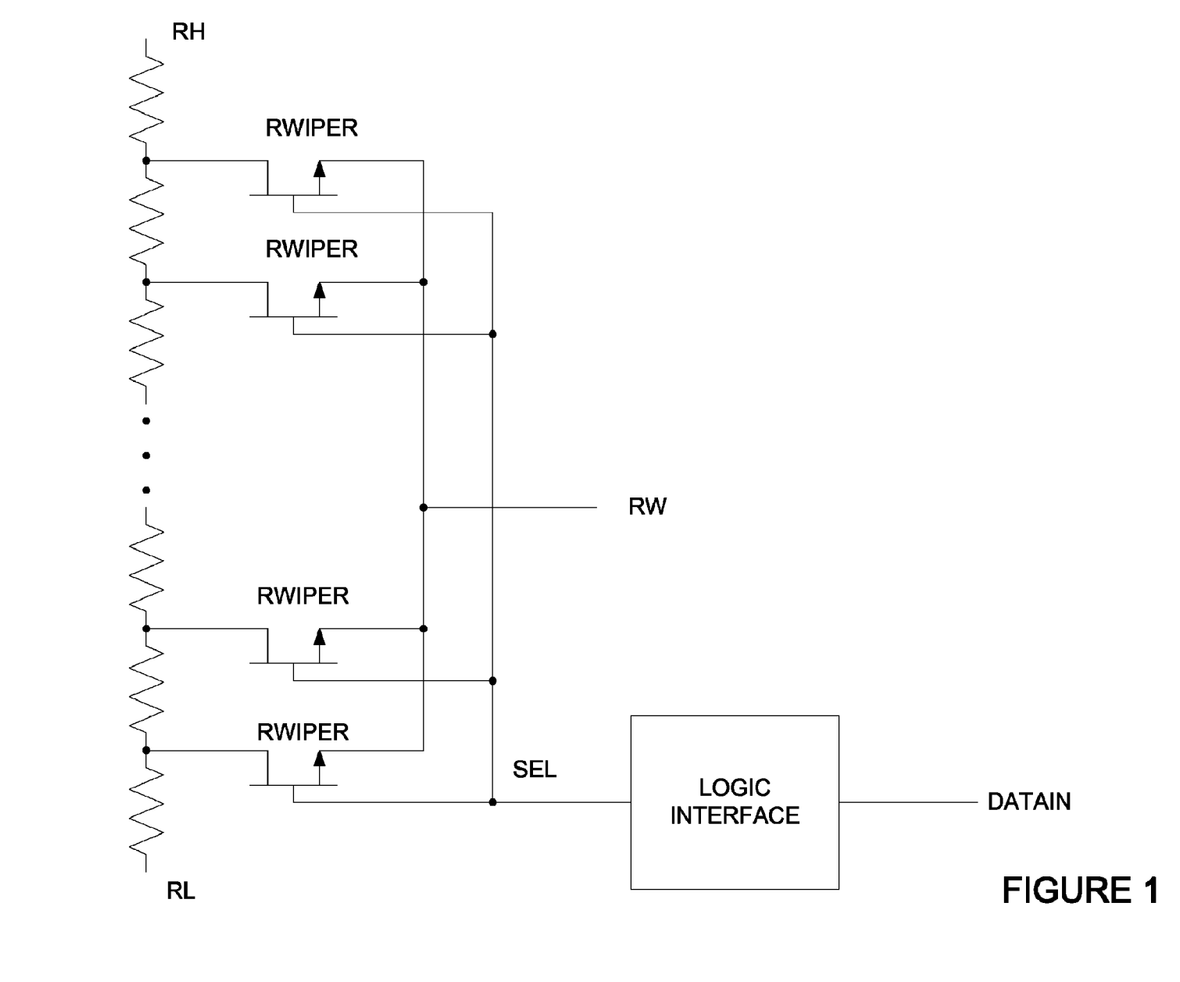
FIG. 1 is a schematic of a DCP that may be improved by the incorporation of an embodiment of the present invention.

FIG. 1 is a schematic of a DCP that may be improved by the incorporation of embodiments of the present invention. This DCP includes a resistor string between a first node RH and a second node RL. In various embodiments of the present invention, this resistor string has different numbers of resistors connected in series where common nodes between the resistors are taps that may be selected. In practical integrated circuits, these individual resistors may be formed as a resistor string made up of many resistors in series and parallel; they are shown here as individual resistors for simplicity.

There may be various numbers of taps, for example there may be 128 taps, or other numbers of taps. Typically, each tap may be selected by a transistor switch or wiper, named here after its resistance value RWIPER. In other embodiments of the present invention, not all taps may be selected, for example where it is known that some taps are not needed. The other ends of the switches are tied together to node RW. One of the switches or wipers is selected by DATAIN, which is a digital word of one or more bits. DATAIN may be serial or parallel data. The logic interface converts this information to a select signal SEL of N bits, where N is the number of switches. The select signal SEL selects one of the transistors or wipers. The selected transistor or wiper connects the tap selected to the RW node.

This type of DCP is typically configured in one of two ways. A voltage may be applied between RH and RL, such that the resistor string acts as a voltage divider at the RW node. Alternately, the resistance between RW and either RL or RH may be utilized as a variable resistance.

There are at least two important sources of error in the value of resistance provided by this circuit. The first is that the resistors in the resistor string can typically only be manufactured within a 20 or 25 percent tolerance. Higher accuracy in resistor values can be achieved by specific and special processing steps thereby increasing the manufacturing cost. Circuit designers usually compensate for this by exploiting the fact that resistors can be made to match each other, rather than relying on their absolute value. However, some applications do require an accurate resistor. Further, the parasitic resistance of the switches, RWIPER, can be large compared to the resistor string, particularly when the lowest or one of lower taps is selected. This can be compensated for by making the transistor size of RWIPER larger, but the result is excessive parasitic capacitance on the RW node, leading to instabilities when this circuit is inserted in a high frequency loop.

Figure 2:
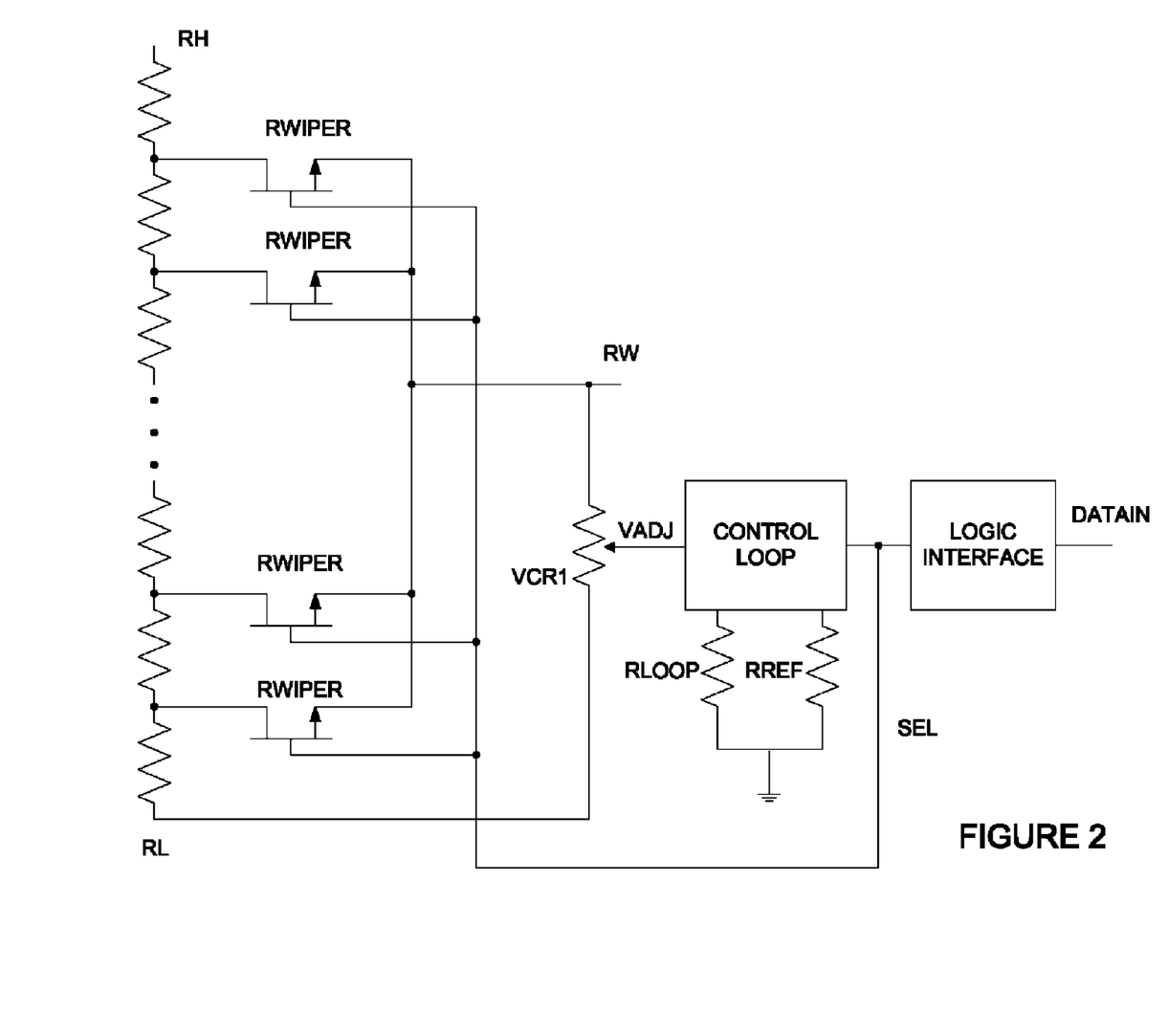
FIG. 2 is a simplified schematic of a DCP according to an embodiment of the present invention.

Accordingly, an exemplary embodiment of the present invention provides a voltage-controlled resistor across the terminals of interest, either from RH to RL, from RW to RL, or from RW to RH, where the voltage-controlled resistor is adjusted by a control loop such that the actual resistance is highly accurate. An example is shown in following figure. In other embodiments of the present invention, more than one voltage-controlled resistor is adjusted by one or more loops.

FIG. 2 is a simplified schematic of a DCP according to an embodiment of the present invention. Again, taps of a resistor string are selected by a number of switches having a common node of RW. Nodes RH and RL may also be selected as taps in various embodiments of the present invention. In this particular example, a voltage-controlled resistor is placed from RW to RL. The same schematic can be used if it is desirable to adjust the resistance between RH and RW by reversing the RH and RL terminals.

The resistance provided by the voltage-controlled resistor is such that the resistance from RW to RL is highly accurate, no matter which wiper or switch is selected by the logic interface. This resistance compensates for errors in the resistor string and for parasitic resistances in the switch or wiper.

Typically, the resistors in the resistor string are made larger than desired, such that the resistor and wiper series combination can be reduced to the correct value by the parallel voltage-controlled resistor. In other embodiments of the present invention, the voltage-controlled resistor is in series with either the RL or RW pins such that the voltage-controlled resistor adds to the total resistance. In these situations, the resistor string is made smaller than desired such that the voltage-controlled resistor adds to the resistor string and wiper series combination bringing the total resistance up to the correct value.

The control loop compares a voltage across one or more loop components to a voltage across one or more reference components, shown here as a reference resistor. In an exemplary embodiment of the present invention, the loop components are arranged to match the resistor string, wiper, and voltage-controlled resistor. As before, one or more logic signals, either series or parallel, is received as DATAIN by the logic interface which provides a select signal that selects one of the switches or wipers. The select signal also is used by the control loop to vary the size of one or more components.

In an embodiment of the present invention, the control loop acts continuously to adjust the provided resistance. This allows the circuit to track and compensate for variations caused by temperature and supply changes, as well as ageing. In another embodiment of present invention, the control loop may operate on a periodic basis, such as during startup, restarts, and other such appropriate times.

Figure 3:
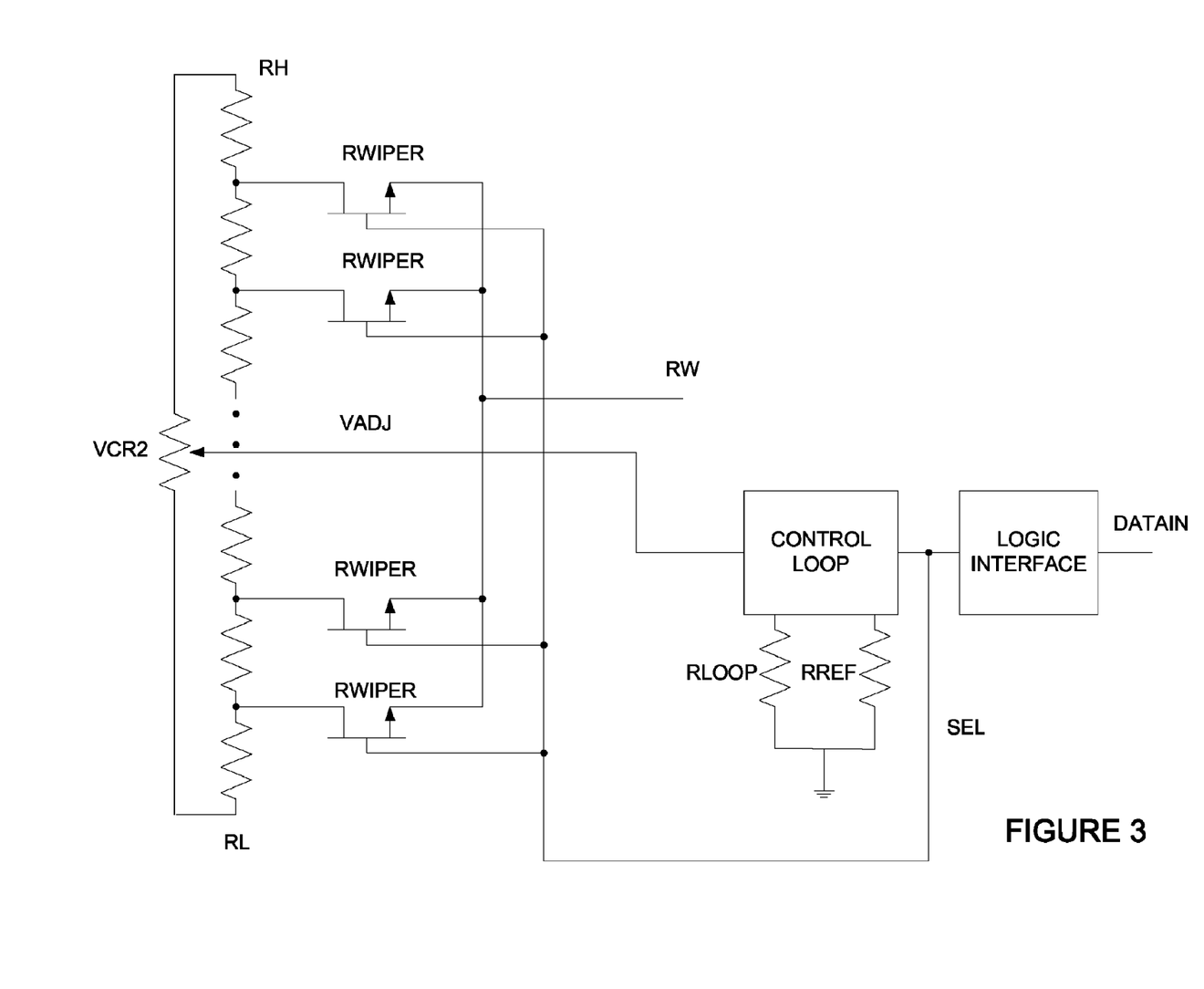
FIG. 3 is a schematic of another embodiment of the present invention.

A voltage-controlled resistor may be placed between RW and RL when a highly accurate adjustable resistor is desired. When it is desirable that the resistance between RH and RL is accurate, a voltage-controlled resistor may be placed between those terminals, as is shown in the following figure. In still other embodiments, more than one voltage-controlled resistor may be used and be controlled by one or more control loops.

FIG. 3 is a schematic of another embodiment of the present invention. In this configuration, a voltage-controlled resistor is placed between the RH and RL terminals. This resistor is adjusted by the control loop such that the resistance between RH and RL is highly accurate. As before, the resistors of the resistor string are typically made larger than desired such that the parallel resistance of the voltage-controlled resistor reduces the overall resistance between RH and RL to the correct value. In other embodiments of the present invention, the voltage-controlled resistor may be placed in series with the resistor string. In this configuration, the resistors of the resistor string are made smaller than desired such that the voltage-controlled resistor may add to the resistor string bringing it up to the correct value.

Figure 4:
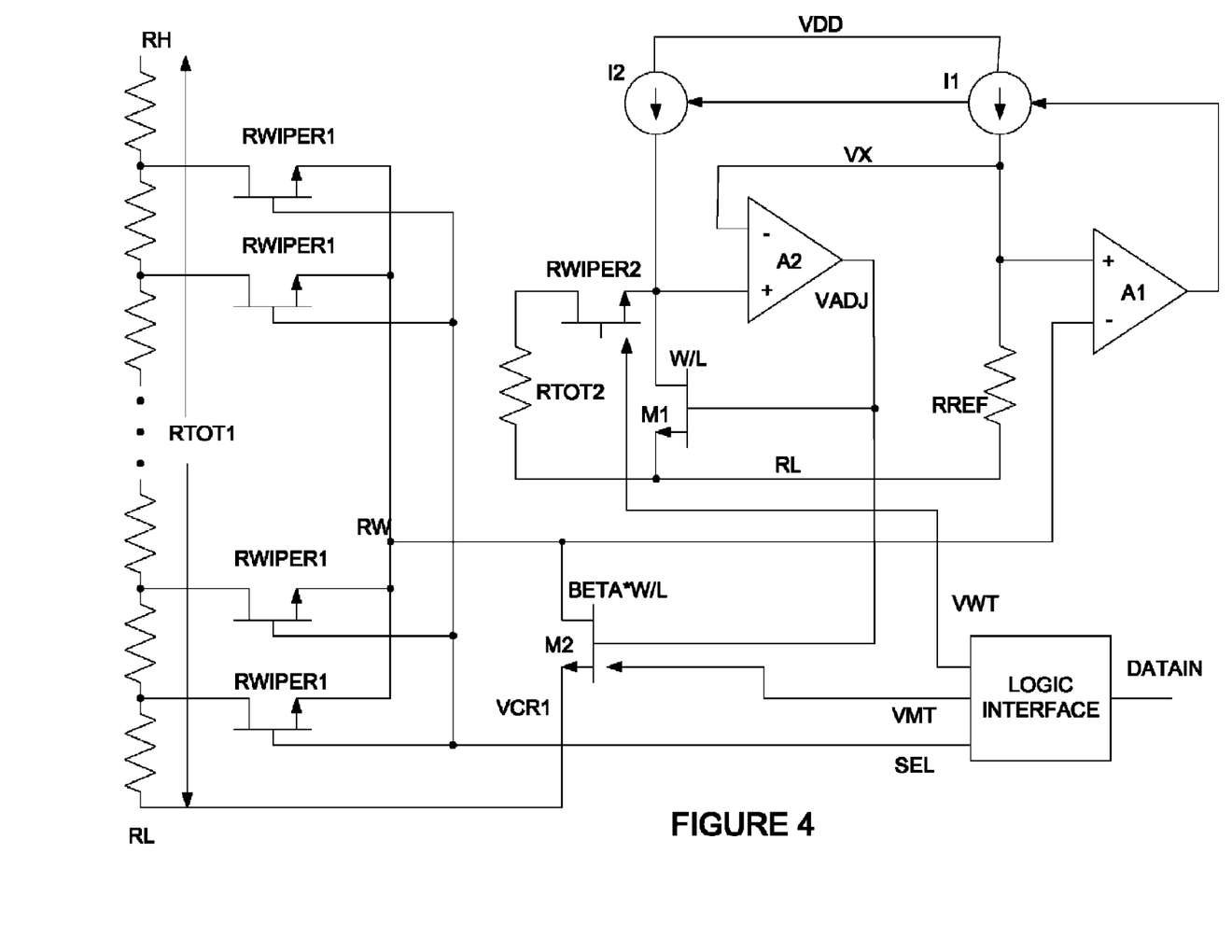
FIG. 4 is a schematic of an embodiment of the present invention illustrating an exemplary control loop.

Again, the control loop compares a reference component to one or more loop components and uses that comparison to generate a control voltage. Further details of the control loop are shown in the following figure.

FIG. 4 is a schematic of an embodiment of the present invention illustrating an exemplary control loop. Again, a resistor string having an overall resistance RTOT1 includes a number of taps selected by a number of switches or wipers that couple to the RW node. The voltage-controlled resistor in this case is a transistor M2. This transistor, as with the other transistors, may be MOSFET, bipolar, or other types of transistors in various embodiments of the present invention. The control loop includes two amplifiers A1 and A2. Amplifier A1 acts to generate a current I1 such that the voltage across the reference resistor RREF is equal to the voltage at node RW. Typically, the value of RREF is set to equal the desired total resistance of the resistor string, though other values are possible. For example, RREF may be equal to the desired value of one resistor in the resistor string. RREF may be off chip, or it may be on chip. If it is on chip, it may be trimmed for improved accuracy, for example with lasers or fuses. In addition, it may be trimmed for making its temperature and voltage coefficient as small as possible.

The current I1 is mirrored as current I2, which is provided to the loop components RTOT2, RWIPER2, and transistor M1. Typically, RTOT2 is equal to RTOT1, RWIPER2 is used to compensate for RWIPER1, and transistor M1 acting as a VCR tunes the loop resistance formed by the combination of RTOT2, RWIPER2 and resistance of M1 to RREF resistance. In various embodiments of the present invention, an additional transistor may be placed in series with RTOT2 depending on the exact implementation of RWIPER1. The current I2 may be equal to I1, or it may be scaled as desired, with appropriate changes in value to RREF. The current I2 generates a voltage across the loop components that is compared to the voltage across the reference resistor RREF. This output voltage is the control voltage VADJ, which is applied to the gates of transistors M1 and M2. In this way, transistor M1 receives the gate voltage required such that the loop components provide a resistance that matches the reference resistor RREF.

This same voltage is applied to the gate of M2 such that the resistance between RW and RL is a desired portion of the reference resistor RREF, which again is equal to the desired total resistance of the resistance string.

Accordingly, the control loop acts to provide a voltage to the gate of M2 such that the resistance between RW and RL is a desired portion of the reference resistor RREF. Specifically, the resistance between RW and RL, referred to as RDCP for simplicity, can be found by:

$$RDCP=(TSEL/TTOT)RREF,$$

where TTOT is the total number of taps in the resistor string and TSEL is the number of the selected tap. Note that these equations hold where the taps are evenly spaced in the resistor string, other variations require modifications to these equations.

When the resistance of the loop components (referred to as RLOOP for simplicity) matches the reference resistor RREF, $$RDCP=(TSEL/TTOT)RLOOP, \text{ and}$$

$$(TTOT)/(TSEL)RDCP=RLOOP, \text{ or}$$

$$RLOOP=BETA*RDCP,$$

where BETA is equal to (TTOT/TSEL).

The resistance between RW and RL, RDCP, is found by:

$$RDCP=((TSEL/TTOT)RTOT1+RWIPER1)\|(RM2),$$

where RM2 is the resistance of the voltage-controlled resistor M2.

The resistance of the loop, RLOOP, is found by:

$$RLOOP=(RTOT2+RWIPER2)\|(RM1),$$

where RM1 is the resistance of the voltage-controlled resistor M1.

Substituting these into equation 1 above, $$(RTOT2+RWIPER2)\|(RM1)=BETA*((TSEL/TTOT)RTOT1+RWIPER1)\|(RM2).$$

One solution for this equation is where $$RTOT2=BETA(TSEL/TTOT)RTOT1=RTOT1;$$

$$RM1=BETA*RM2; \text{ and}$$

$$RWIPER2=BETA*RWIPER1.$$

From these equations, it can be seen that either M1 or M2, and either RWIPER1 or RWIPER2, can be adjusted as different wipers are selected. The resistance between RW and RL varies naturally as different switches or wipers are selected, so RTOT2=RTOT1. In a particular embodiment of the present invention, RWIPER2 is varied such that the transistors used to make RWIPER1 can be kept small to reduce their parasitic capacitances. Further, transistor M2 is varied such that the control voltage does not need to change, at least as dramatically, as different wipers or switches are selected. Selecting M1 to be varied in size would lead to larger changes in the in the control voltage, which may cause headroom problems. Varying M1 (and not M2) depending on the wiper position, and similarly varying RWIPER1 (rather than RWIPER2) are also possible in other embodiments of the present invention.

There are at least three ways to vary a resistance provided by a transistor. The first is to vary its gate voltage, as is done with transistors M1 and M2. The other two ways involve varying the width of the transistor. It should be noted that the length of transistors can also be varied, but for matching purposes, it is usually more accurate to vary the width of a transistor.

This is particularly true when multiple sizes of a transistor are used for improved matching.

The first of the two ways to vary a transistor's resistance by varying its width is used to vary the impedance provided by M2. Again, $$RM1=BETA*RM2.$$

Since the resistance of a transistor is inversely proportional to its width, $1/W1=BETA*(1/W2)$, where W1 and W2 are the widths of transistors M1 and M2. Therefore, $BETA*W1=W2$.

Accordingly, if the width of transistor M1 is W, the width of transistor M2 is made to be BETA*W. Again, BETA=TTOT/TSEL. This leads to some awkward values for BETA. Specifically, as taps of a 128 tap string are selected beginning with the lowest tap, BETA is equal to 128, 64, 42.667, 32, 25.6 . . . 1.032, 1.024, 1.01, 1. To reduce errors, for example where BETA is 42.667, 43 devices can be used, 42 of which match M1, and one that is ⅔ the size of M1. This can also be done by using various banks of transistors in place of M2 where different banks can have different number of transistors connected in parallel. Which bank should be ON can be controlled by a digital logic to match the total width of the bank as close to the values mentioned above. To make the matching between M1 and M2 more effective, M1 can be implemented as a number of small parallel devices such that $BETA*W1=W2$ is achieved as accurately as possible.

The second of these two ways is used to vary the impedance provided by RWIPER2. Again, $$RWIPER2=BETA*RWIPER1, \text{ so}$$

$$1/W2=BETA*(1/W1),$$

where W2 is the width of RWIPER2 and W1 is the width of RWIPER1, $$W1=BETA*W2, \text{ or}$$

$$W1=(TTOT/TSEL)W2, \text{ so}$$

$$W2=(TSEL/TTOT)*W1.$$

A new device having a width of W1/TTOT is used. A number of these devices equal to TSEL are then connected in parallel to obtain an overall width for RWIPER2 of (TSEL/TTOT)W1. Again, this method could be used to vary the size of transistor M1, instead of varying the size of M2 as outlined above. Also, the method of varying M2 above could be used to vary the size of RWIPER1, instead of using the above method to vary the size of RWIPER2.

Figure 6A:
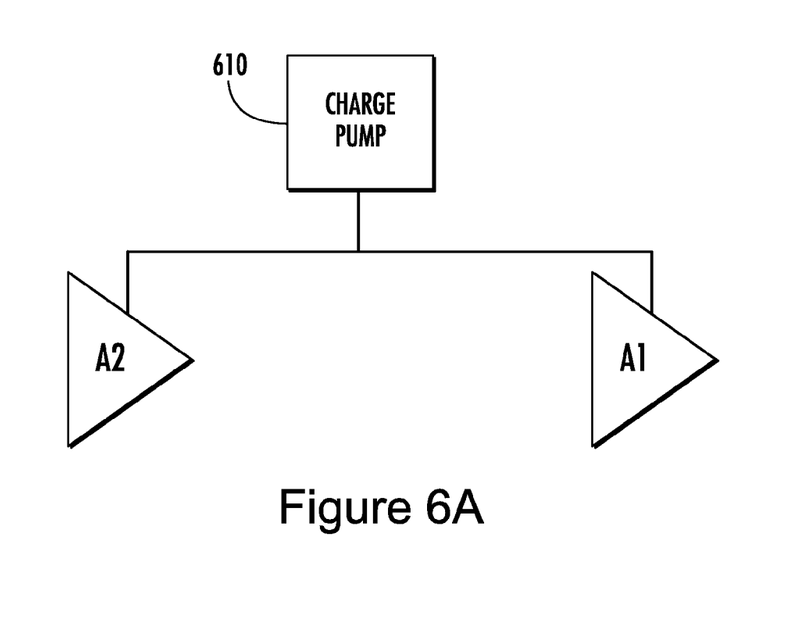
FIGS. 6A and 6B illustrate charge pumps of alternate embodiments of the present invention.
Figure 6B:
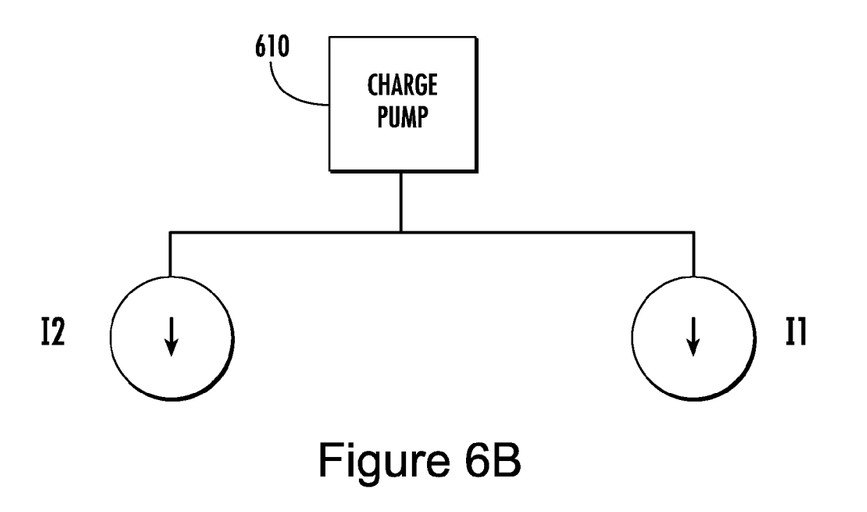

In a specific embodiment of the present invention, a charge pump 610 is used to increase the voltage available to the current sources I1 and I2 (as shown in FIG. 6B) and/or the amplifiers (as shown in FIG. 6A) in the control loop. The change pump 610 receives VDD and provides a higher voltage supply. This allows a higher voltage to be received at RH as compared to using the VDD supply directly.

Figure 7:
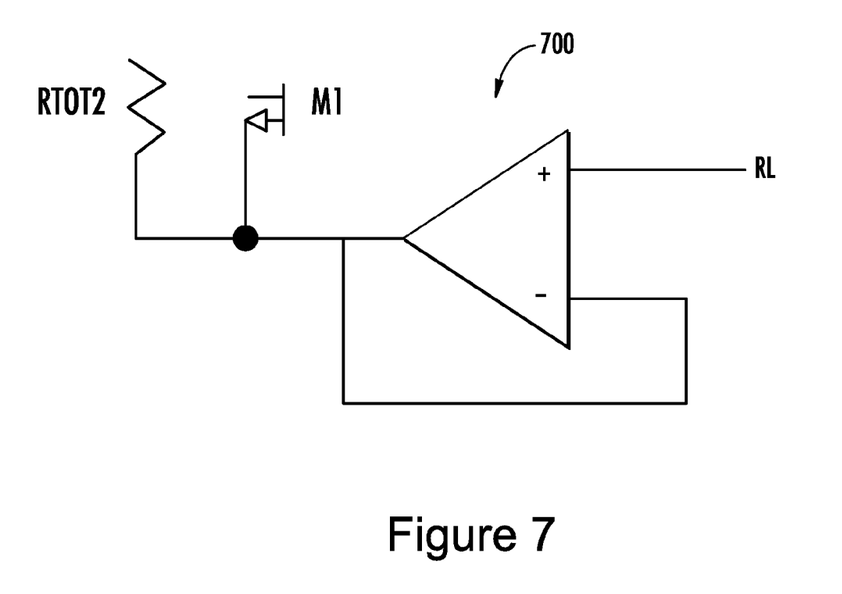
FIG. 7 illustrates a buffer of one embodiment of the present invention.

In another specific embodiment of the present invention, an additional buffer or amplifier is included as shown in FIG. 7 generally at 700. The input of this amplifier is coupled to receive the voltage at the RL terminal of the DCP and an output is coupled such that the output of the buffer drives the common node where the source terminal of M1, bottom terminal of RTOT2 and the bottom terminal of RREF are connected. This prevents loop current from flowing through the DCP RL terminal, which can degrade the accuracy of the DCP, when the RL terminal of the DCP is not connected to the common ground terminal of the device. For example, an external component or circuit, such as a resistor, diode, or any other device, may be connected between the RL terminal of the DCP and the common ground terminal of the device. The additional buffer or amplifier prevents the loop current from passing through the DCP RL terminal. Instead, the loop current flows to the common ground terminal of the device through an output stage of the buffer.

Figure 5:
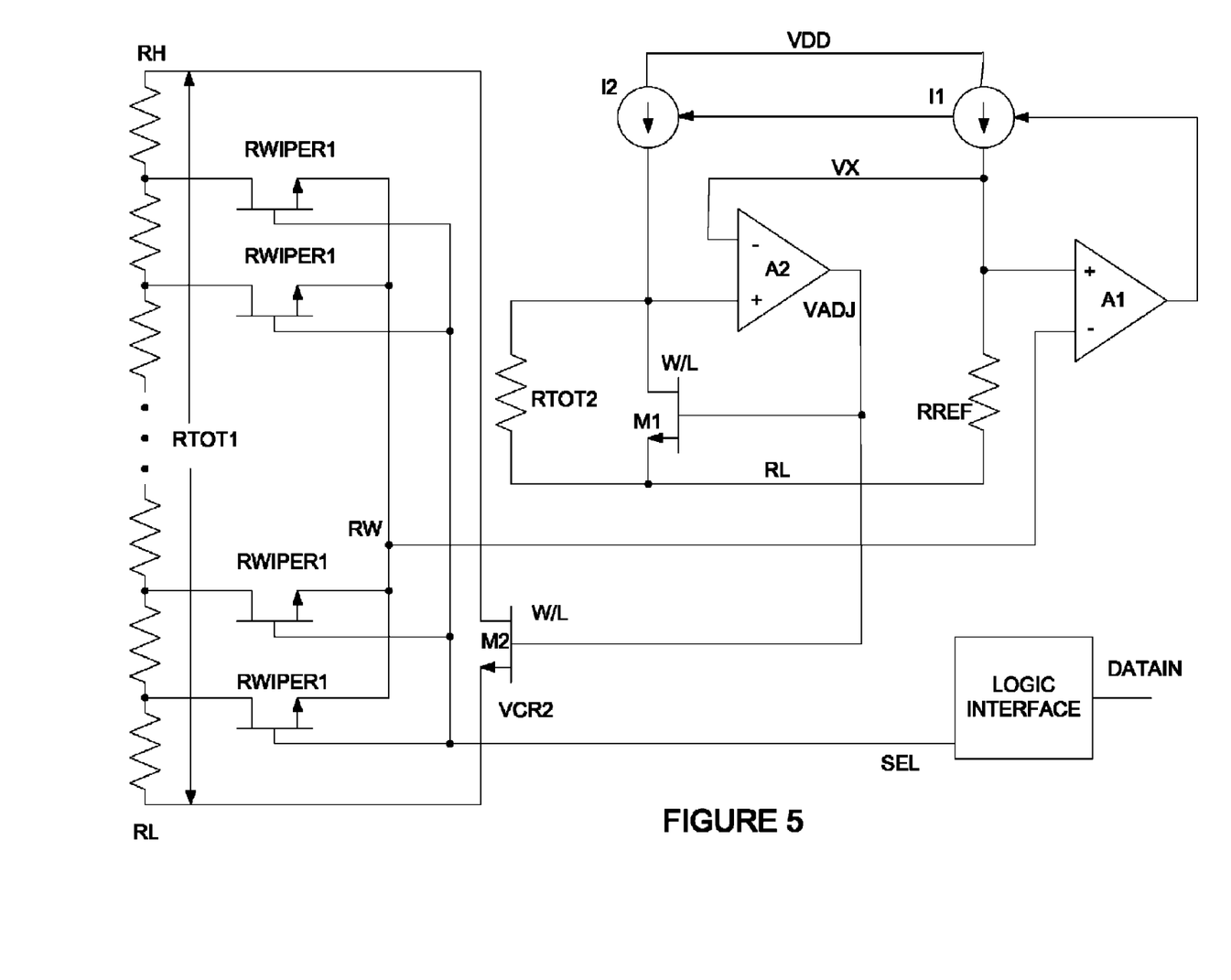
FIG. 5 is a schematic of another embodiment of the present invention illustrating an exemplary control loop.

FIG. 5 is a schematic of another embodiment of the present invention illustrating an exemplary control loop. In this example, the voltage-controlled resistor is implemented as transistor and connected across nodes RH and RL, such that the resistance between nodes RH and RL is highly accurate.

In this embodiment of the present invention, since the wiper resistance is not in series with the resistor string between RH and RL, RWIPER2 is not needed in the control loop. In embodiments where it is desirable to implement one control loop that may be used to adjust either the resistance between RW and RL or between RH and RL, RWIPER2 may be bypassed using a T-switch or other low impedance component. Since the resistance between RH and RL does not vary with a number of taps selected, the size of transistor M2 does not need to be adjusted but can be set at its highest resistance, which corresponds to a width of W, where W is the width of transistor M1.

In various embodiments of the present invention, voltage-controlled resistors may be used to make the impedance between RH and RL, or between RW and RL highly accurate. In some embodiments, one control loop is used. In these embodiments, if it is determined that the impedance between RH and RL is to be made accurate, for example, by voltage sensing, the voltage-controlled resistor between those nodes is controlled by the control loop. If it is determined that the impedance between RW and RL is to be made accurate, the voltage-controlled resistor between those nodes is controlled by the control loop. In other embodiments two control loops are used, one for each voltage-controlled resistor. In such a configuration, care must be taken to ensure that the two control loops do not compete and cause instabilities. In another embodiment of the present invention, another control loop with an additional voltage-controlled resistor placed between RH and RW terminals may be used.

The above description of exemplary embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated.

What is claimed is:

1. An integrated circuit including a digitally controlled potentiometer comprising:
   a first resistor string comprising a plurality of resistors coupled in series between a first node and a second node;
   a first plurality of switches, each coupled between a node common to two of the plurality of resistors and a third node;
   a first voltage-controlled resistor coupled to the third node, wherein the first voltage-controlled resistor is further coupled to receive a control voltage;
   a control loop to compare a plurality of reference components with a reference resistor and generate the control voltage; and
   a logic circuit to receive a logic signal and to selectively close one of the first plurality of switches based on the logic signal.

2. The integrated circuit of claim 1 wherein the reference components comprise:
   a second resistor string, wherein the second resistor string matches the first resistor string in either number of elements or total resistance;
   a second plurality of switches; and
   a second voltage-controlled resistor.

3. The integrated circuit of claim 2 wherein the second plurality of switches and the second voltage-controlled resistor are adjusted based on which of the first plurality of switches are closed.

4. The integrated circuit of claim 1 wherein the reference resistor is an external resistor.

5. The integrated circuit of claim 1 wherein the reference resistor is an internal resistor.

6. The integrated circuit of claim 5 wherein the reference resistor is trimmed.

7. The integrated circuit of claim 1 wherein the first voltage-controlled resistor is coupled between the second node and the third node, such that the resistance between the second node and the third node is a desired value.

8. The integrated circuit of claim 1 wherein the first voltage-controlled resistor is coupled between the third node and a fourth node, such that the resistance between the third node and the fourth node is a desired value.

9. The integrated circuit of claim 1 wherein the first voltage-controlled resistor comprises a MOSFET transistor.

10. The integrated circuit of claim 1 wherein the first voltage-controlled resistor comprises a MOSFET transistor, and a gate of the MOSFET transistor is coupled to receive the control voltage.

11. The integrated circuit of claim 1 further comprising:
    a second voltage-controlled resistor coupled between the first node and the second node.

12. The integrated circuit of claim 1 further comprising:
    a charge pump to provide an increased voltage to the control loop.

13. The integrated circuit of claim 12 wherein use of the charge pump allows a higher voltage to be received at the first node.

14. The integrated circuit of claim 1 further comprising:
    a buffer amplifier having an input coupled to the second node and an output coupled to a fourth node, the fourth node in the control loop.

15. A method of providing a resistance between a first terminal and a second terminal comprising:
    receiving a digital signal corresponding to a desired resistance;
    using the digital signal to select a first tap of a resistor string with a first switch;
    using the digital signal to adjust a resistance of a first transistor coupled between the first terminal and the second terminal;
    using the digital signal to adjust a resistance of a second transistor in a reference network;
    comparing the resistance of the reference network to a reference resistor to generate a control voltage;
    applying the control voltage to a gate of the first transistor.

16. The method of claim 15 wherein the reference network further comprises a resistor formed to match the resistor string.

17. A system comprising:
- a digital data input line;
- a digitally controlled potentiometer formed on an integrated circuit, the digitally controlled potentiometer including:
- a first resistor string comprising a plurality of resistors coupled in series between
- a first node and a second node;
    - a first plurality of switches, each coupled between a node common to two of the plurality of resistors and a third node;
    - a first voltage-controlled resistor coupled to the third node, wherein the first voltage-controlled resistor is further coupled to receive a control voltage;
    - a control loop that compares a plurality of reference components with a reference resistor and generates the control voltage; and
    - a logic interface that receives a digital signal from the digital data input line and to selectively close one of the first plurality of switches based on the digital signal.

18. The system of claim 17 further comprising:
- a voltage source, the voltage source coupled across the first node and the second node;
- wherein a voltage at the third node varies as a function of the digital signal.

19. The system of claim 17, wherein a resistance between the first node and the third node varies as a function of the digital signal.

* * * * *